(12) United States Patent
Schwartz et al.

(10) Patent No.: US 7,815,963 B2
(45) Date of Patent: *Oct. 19, 2010

(54) ENHANCED BONDING LAYERS ON TITANIUM MATERIALS

(75) Inventors: Jeffrey Schwartz, Princeton, NJ (US); Michael J. Avaltroni, Staten Island, NY (US); Kim S. Midwood, Princeton, NJ (US); Jean E. Schwarzbauer, Princeton, NJ (US); Ellen Gawalt, Chicago, IL (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/115,067

(22) Filed: May 5, 2008

(65) Prior Publication Data

US 2008/0206443 A1 Aug. 28, 2008

Related U.S. Application Data

(60) Division of application No. 10/179,743, filed on Jun. 24, 2002, which is a continuation-in-part of application No. 09/668,080, filed on Sep. 22, 2000, now Pat. No. 6,645,644, which is a continuation-in-part of application No. 08/794,833, filed on Feb. 4, 1997, now Pat. No. 6,146,767.

(60) Provisional application No. 60/300,144, filed on Jun. 22, 2001, provisional application No. 60/155,398, filed on Sep. 22, 1999, provisional application No. 60/028,949, filed on Oct. 17, 1996, provisional application No. 60/035,040, filed on Jan. 13, 1997.

(51) Int. Cl.
    *A61L 6/083* (2006.01)
(52) U.S. Cl. ............... 427/2.26; 427/2.24; 427/2.27; 427/430.1; 427/435; 427/443.2
(58) Field of Classification Search ............. 427/2.26
    See application file for complete search history.

(56) References Cited

U.S. PATENT DOCUMENTS

| | | |
|---|---|---|
| 3,224,908 A | 12/1965 | Duch et al. |
| 3,293,088 A | 12/1966 | Herbst et al. |
| 3,634,146 A | 1/1972 | Wystrach et al. |
| 3,772,355 A | 11/1973 | Merz |
| 4,403,941 A | 9/1983 | Okiura et al. |
| 4,578,156 A | 3/1986 | Plazter |
| 4,788,176 A | 11/1988 | Wieserman et al. |
| 4,830,993 A | 5/1989 | Legrand et al. |
| 4,909,846 A | 3/1990 | Barfurth et al. |
| 4,929,589 A | 5/1990 | Martin et al. |
| 4,962,073 A | 10/1990 | Martin et al. |
| 4,994,429 A | 2/1991 | Wieserman et al. |
| 5,032,237 A | 7/1991 | Wieserman et al. |
| 5,102,507 A | 4/1992 | Wieserman et al. |
| 5,103,550 A | 4/1992 | Wefers et al. |
| 5,126,210 A | 6/1992 | Wieserman et al. |
| 5,185,208 A | 2/1993 | Yamashita et al. |
| 5,231,151 A | 7/1993 | Spencer et al. |
| 5,277,788 A | 1/1994 | Nitowski et al. |
| 5,279,720 A | 1/1994 | Divigalpitiya |
| 5,286,571 A | 2/1994 | Mirkin et al. |
| 5,397,642 A | 3/1995 | Li et al. |
| 5,463,804 A | 11/1995 | McCleary et al. |
| 5,767,032 A | 6/1998 | Hokkanen et al. |
| 6,020,047 A | 2/2000 | Everhart |
| 6,030,710 A | 2/2000 | Nitowski et al. |
| 6,066,403 A | 5/2000 | Sherwood et al. |
| 6,129,928 A | 10/2000 | Sarangapani et al. |
| 6,146,767 A | 11/2000 | Schwartz |
| 6,167,609 B1 | 1/2001 | Marinelli et al. |
| 6,433,359 B1 | 8/2002 | Kelley et al. |
| 6,436,475 B1 | 8/2002 | Adler et al. |
| 6,488,990 B1 | 12/2002 | Wetterer et al. |
| 6,645,644 B1 | 11/2003 | Schwartz et al. |
| 6,824,882 B2 | 11/2004 | Boardman et al. |
| 6,866,791 B1 | 3/2005 | Breen et al. |
| 2002/0130441 A1 | 9/2002 | Robinson et al. |
| 2003/0186914 A1 | 10/2003 | Hofer et al. |
| 2004/0049287 A1 | 3/2004 | Descouts et al. |
| 2004/0054422 A1 | 3/2004 | Descouts et al. |
| 2005/0031910 A1 | 2/2005 | Schwartz et al. |

FOREIGN PATENT DOCUMENTS

JP  2014863  1/1990

(Continued)

OTHER PUBLICATIONS

Miller et al., "The Importance of Liquid Kinetic Basicity on the Preparation of Surface Supported Zirconium Complexes by Proton Transfer from Hydroxylated Aluminum on Silicon," J. Am. Chem. Soc., 115, 8239-8247, 1993.

Galiardi et al., "Pre-Resonance Raman Characterisation of Metal-Organic Films from titanium Alkoxide Carboxylate Complexes," Mat. Res. Soc. Syp. Proc., 180,801-805, 1990.

Labimis et al., "Orthogonal Self-Assembled Mono-Layers: Alkanethiols on Gold and Alkane Carboxylic Acids on Alumina," Science, 245, 845, 1989.

(Continued)

*Primary Examiner*—Michael Barr
*Assistant Examiner*—Andrew Bowman
(74) *Attorney, Agent, or Firm*—Fox Rothschild LLP

(57) ABSTRACT

The present invention provides a dense-coverage, adherent phosphorous-based coating on the native oxide surface of a material. Disclosed phosphorous-based coatings include phosphate and organo-phosphonate coatings. The present invention also provides further derivatization of the phosphorous-based coatings to yield dense surface coverage of chemically reactive coatings and osteoblast adhesion-promoting and proliferation-promoting coatings on the native oxide surface of a titanium material.

22 Claims, No Drawings

FOREIGN PATENT DOCUMENTS

| | | | |
|---|---|---|---|
| JP | 5224448 | | 9/1993 |
| JP | 10081517 | * | 3/1998 |
| WO | WO02/40073 | * | 11/2000 |
| WO | 0220873 A2 | | 3/2002 |
| WO | 0240073 A1 | | 5/2002 |
| WO | 0240075 A1 | | 5/2002 |

OTHER PUBLICATIONS

Seto, "Stabilization of Self-Assembled Monolayers on Native Oxides," Thesis No. 6066, Available Princeton University Library System on Oct. 17, 1995.

* cited by examiner

ENHANCED BONDING LAYERS ON TITANIUM MATERIALS

CROSS REFERENCE TO RELATED APPLICATIONS

The present application is a Divisional of U.S. patent application Ser. No. 10/179,743, filed Jun. 24, 2002, which application claims priority under 35 U.S.C. §119(e) of U.S. Provisional Application Ser. No. 60/300,144 filed Jun. 22, 2001 and is also a Continuation-In-Part and incorporates by reference U.S. application Ser. No. 09/668,080, filed Sep. 22, 2000, now U.S. Pat. No. 6,645,644, which application in turn claims priority under 35 U.S.C. §119(e) from U.S. Provisional Patent Application Ser. No. 60/155,398, filed Sep. 22, 1999, and which is also a Continuation-In-Part of U.S. application Ser. No. 08/794,833, filed Feb. 4, 1997, now U.S. Pat. No. 6,146,767, which application, in turn, claims priority under 35 U.S.C. §119(e) from U.S. Provisional Patent Application Ser. Nos. 60/028,949 filed Oct. 17, 1996 and 60/035,040 filed Jan. 13, 1997. The disclosures of all seven applications are incorporated herein by reference.

STATEMENT REGARDING FEDERALLY FUNDED RESEARCH

This invention was made with government support under Grant #RR014196 awarded by the National Institutes of Health. Accordingly, the U.S. Government has certain rights in this invention.

FIELD OF THE INVENTION

The present invention relates to coatings bonded to the oxide surface of titanium metal and titanium alloys (collectively, titanium materials) by treatment of the oxide surface with phosphorous-based acids. The present invention further relates to implantable medical devices fabricated from titanium materials having these bonded coatings which impart an osteoconductive surface to the medical device. In addition, the present invention relates to methods for forming such coatings on the surface of implantable medical devices to provide an osteoconductive surface, and methods for using implantable devices bearing an osteoconductive surface.

BACKGROUND ART

Titanium metal combines the strength of steel with the light weight of aluminum, and for this reason the metal and its alloys are used extensively in the aerospace and aviation and high performance sports equipment industries. Titanium metal and its alloys (hereinafter, "titanium materials") are also resistant to corrosion under ambient conditions. Because of its mechanical properties and chemical resistance to degradation by bodily fluids, titanium materials are used extensively to fashion metal fitments used as dental and orthopedic implants (medical implants). When a metal fitment is used as a medical implant, it is important to create a stable bond between bone tissue and the surface of the implant. Poor bonding at the interface between the surface of the implant and the bone tissue leads to low mechanical strength of the bone-to-implant junction and the possibility of subsequent implant failure. An important goal for interface optimization is to use species which are biocompatible and which enable bone mineralization at the interface following implantation. Bone tissue is a combination of protein and mineral content, with the mineral content being in the form of hydroxyapatite. Currently, there is no effective way to obtain strong attachment of incipient bone with the implant material at the interface between the surfaces of the two materials in order to "stabilize" the implant.

The problem of synthesizing an adhesion-promoting interface on implants is often approached from the prospective of high temperature methods, including using plasma or laser-induced coating techniques. However, these methods engender problems of implant heating and surface coverage. For example, calcium phosphate deposition at high temperatures can give rise to ion migration. Plasma-induced phosphate coating of a titanium substrate gives surface hydroxyapatite as well as surface calcium phosphate, titanates and zirconates. Therefore, control of surface stoichiometry can be problematic, and defects at the interface may translate into poor mechanical strength.

The use of intermediate layers, for example of zirconium dioxide, to enhance hydroxyapatite adhesion and interface mechanical strength has been explored with success. However, a practical limitation involving laser or plasma deposition is that it is hard to obtain comprehensive coverage on a titanium implant of complex 3-dimensional structure. The zirconium dioxide interface formed at high temperatures is of low surface area and maintains few, if any, reactive functional groups for further surface modification chemistry. A silicate, phosphate or phosphonate interface can function to nucleate the growth of hydroxyapatite, thereby minimizing implant failure and the attendant need for serial revision implant surgery, which can be a consequence of unstable implant-to-bone interaction, but, as described below, there is little success of providing such surfaces on the oxide surfaces of titanium materials.

Solution-phase surface processing does not suffer from the practical limitations of surface coverage that can be attendant with plasma or laser-based deposition methods, and procedures involving formation of hydroxyapatite from solution, often using sol-gel type processing, have been accomplished. Elegant methodologies have been developed in which graded interfaces have been prepared, extending from the pure implant metal to the biomaterial at the outer extremity by way of silicates. However, while solution-based procedures are inexpensive and give rise to materials resistant to dissolution by bodily fluids, adhesion of the hydroxyapatite to the implant metal is less strong than is observed when deposition is accomplished by plasma spraying techniques.

The deficiency of these solution approaches may lie in the nature of the native oxide surface of titanium materials. Exposure of a clean surface of titanium materials to oxygen results in the spontaneous formation of surface titanium oxides (native oxide). The exact chemical stoichiometry and structure of these oxides varies from material to material, and with depth in the oxide layer, with environmental variables, and with the processing history of the material. The oxide layer may be stoichiometric, super-stoichiometric, or sub-stoichiometric with respect to $TiO_2$, a stable oxide of titanium. Generally, the uppermost layer of the native oxides comprises some form of $TiO_2$. It may be crystalline, but if crystalline, it is generally disordered. Typically, many different phases exist within the oxide layer between the metal and the ambient environment. Generally, the uppermost layer of oxide includes widely dispersed hydroxyl functional groups bonded to a titanium atom. The surface forms spontaneously by exposing the metal or alloy to the ambient environment, and is alternatively described as the "native oxide surface" of a titanium material.

This oxide layer protects the underlying material from further chemical attack in that it is generally resistant to further chemical reaction. This property of the oxide surface of titanium materials mitigates against the adhesion other moieties to it, for example, bone tissue, and also makes application of an adhesion-promoting coating to the native oxide surface problematic. For example, a phosphorous-based acid incorporating into its structure an organic moiety, for example organo-phosphonic acid, does not readily form an adherent coating with the bulk metal under ambient conditions. This is in contrast to other metals that possess oxide coatings, for example, tin, iron, aluminum and copper, or their alloys, for example, steel, or bulk oxides, for example, mica, all of which yield an adherent film when treated with such acids. Film formation of the type observed between, for example, zirconium surface oxides and organophosphonic acids, is not observed with the oxide surface of titanium materials. An example of this is described by Gao et al. in Langmuir, Vol. 12 (1996) p. 6429.

For many materials other than titanium, as described above, the native oxide surface can be altered chemically (derivatized) by exposing the surface to various hydrolytically reactive reagents. An example of derivatizing an oxide surface in this manner is exposure of the surface of a silicate (silicon oxide) to a trimethylsilyl derivative which "silanates" the surface, converting it from a hydrophilic surface to one that is hydrophobic by bonding trimethyl silyl functional groups to the native oxide surface. Typically, chemically derivatizing a surface is the most cost-effective method to achieve uniform surface coverage on surfaces having complex shapes, and in general represents the least impact to the mechanical properties of the material derivatized compared to other surface modification techniques.

Silanization has long been considered the benchmark method for attaching organics to titanium and its alloys, for example, Ti-6Al-4V, via their native oxide coatings. Direct silane-surface bonding is limited by surface hydroxyl group content, and the OH group content of the Ti native oxide surface is low, accounting for only about 15% of total surface oxygen. Low yields of direct surface silanization result, and silane reagent crosslinking can be the dominant mode of reactivity. Unfortunately, surface-bound and cross-linked siloxanes can be hydrolytically unstable, which can further reduce amounts of key organics that are coupled to simple surface silanization reagents under aqueous conditions.

It will be appreciated that for metal oxide surfaces which are not derived from titanium metal or its alloys, for example, the oxide surface of aluminum and its alloys or the oxide surface of silicon, it is common to carry out reactions between organometallic complexes and hydroxyl groups terminating the oxide layer to provide for a surface which is amenable to further derivatization or passivation. For these "non-titanium material" oxide surfaces, in cases in which the natural occurrence of hydroxyl groups per unit area of surface is too sparse to provide for the formation of a dense surface layer of the derivatization products, it is known to subject the oxide surface to a variety of hydrothermal treatment schemes to increase the density of hydroxyl sites and improve the reactivity of the surface toward derivatization.

In general, the coverage of naturally occurring hydroxyl sites which form on titanium material oxide surfaces is too sparse to provide dense-coverage layers of derivatization product on the surface of the material by traditional derivatization routes. Additionally, attempts to increase the actual density (sites/unit area) of hydroxyl sites in the surface oxides of titanium materials results in "roughening" of the surface, which, while increasing the number of hydroxyl sites projected (nominal) surface area of the bulk material, also increases the actual surface area of the material, and, consequently the density of hydroxyl sites/unit area remains approximately constant.

If the protective oxide layer of a titanium material is dissolved under conditions in which its re-formation is inhibited, rapid corrosion of the material will occur, an example of which is reported by Fang et al. in Corrosion, Vol. 47, (1991), p 169. Reducing acids, for example hydrobromic, sulfuric, and phosphoric acid, under the proper conditions of heat and acid concentration, can attack titanium metal and its alloys. Such attack is especially facile when oxidizing agents, for example, air, are excluded from the surface of the material under attack. For example, titanium metal rapidly dissolves in 85% phosphoric acid at 80-100° C. yielding a solution from which titanium(III)dihydrogen orthophosphate (Ti[$H_2PO_4$]$_3$, (hereinafter, "Ti-phosphate") can be isolated.

A need exists for a methodology that combines the benefits such as those obtained from the physical deposition of interfacial zirconium dioxide with the coverage, processing and speciation control of solution-based methods described above. Additionally, a need exist for a methodology that makes the oxide surface of titanium materials amenable to solution process derivatization that establishes dense-coverage, robust and adherent coatings amenable to establishing a strong interface between the oxide surface and materials with which the surface is placed in contact, for example, adhesion between medical implants made of titanium materials and the tissues into which they are implanted.

SUMMARY OF THE INVENTION

It has now been discovered that heating a self-assembled layer of a phosphoric or phosphonic acid on the native oxide surface of a substrate will form an adherent coating layer that may be further derivatized with adherent species. Therefore, according to one aspect of the present invention there is provided an adherent, self-assembled phosphorous-based coating layer bonded to the native oxide surface of a material by heating a self-assembled layer of a phosphorous-based acid formed on the surface of the oxide until the self-assembled layer is bonded to the oxide surface, the phosphorous-based acid being chosen from phosphoric- or organo-phosphonic acids.

The present invention thus includes the methods by which the coated substrates of the present invention are formed. Therefore, in accordance with another embodiment of the present invention there is provided a method of bonding a layer of a phosphorous-based acid moiety to a titanium oxide surface comprising coating said oxide surface with a phosphorous-based acid moiety self-assembled layer and heating said coated oxide surface until said self-assembled layer is bonded thereto, the phosphorous-based acid moiety comprising the self-assembled layer being selected from the group consisting of phosphoric acid and organo-phosphonic acids.

Preferred coatings are those which have been formed from phosphoric acid and alkylene- and arylene-organo-phosphonic acids, including substituted alkylene and arylene-phosphonic acids. More preferred are substituted alkylene phosphonic acids with a reactive substituent omega to the phosphonic acid functional group. Preferred oxide surfaces are the native oxide surfaces of titanium materials. It is preferred for the phosphoric acid to be in the form of an aqueous solution having a pH more acidic than about pH 3.0.

The coatings of the present invention promote the adhesion of bone tissue to the substrates on which they are coated. Therefore, in addition to the coatings of the present invention and the methods by which they are formed, the present invention also provides methods for coating implantable medical devices having a titanium oxide surface for contacting bone tissue with the coating layers of the present invention, coated implantable devices and implantation methods incorporating the coated devices.

Other features of the present invention will be pointed out in the following description and claims, which disclose, by way of example, the principles of the invention and the best methods which have been presently contemplated for carrying them out.

DETAILED DESCRIPTION OF THE PREFERRED EMBODIMENTS

The present invention provides a dense-coverage, adherent, phosphorous-based coating bonded to the native oxide surface of a titanium material. The present invention also provides modified phosphorous-based coatings that effectively bond a dense-coverage, adherent coating of chemical species to the native oxide surface of a titanium material. Thus, the present invention provides, under mild conditions, on a native oxide surface of a titanium material, a derivatized surface which modifies the chemical properties of the native oxide surface. The present invention also provides a method of producing those surfaces which may be adapted to provide an even coating of the derivatized surface over a complex shape.

While the present invention can provide derivatized surfaces on the native oxide of any titanium material, it is anticipated that the present invention will be most useful in the provision of derivatized surfaces which promote bone adhesion to the surface of medical implants, thus the present invention also provides a derivatized surface that promotes the adhesion and proliferation of osteoblasts, and provides a method of synthesizing such a surface. This aspect of the present invention is particularly useful for securely bonding replacement joints to bone tissue, for example, knee and hip replacements. Therefore, in addition to the coatings of the present invention and the methods for forming the coatings, the present invention provides a coating for implantable medical devices, methods for improving the adhesion to bone tissue of implantable medical devices, and methods for implanting medical devices by first coating them according to the present invention.

The coatings of the present invention are more amenable to chemical interaction with other chemical species than the native oxide surface upon which they are formed, but the underlying material (substrate) retains some of the native oxide surface, and thus the degradation-resistant properties of the native oxide surface. It will be appreciated that the coatings of the present invention may be formed as well on the native oxide surfaces of materials other than titanium materials, and will be equally effective in providing a surface having dense-coverage by moieties which are amenable to the further derivatization reactions, for example, those described below.

The phosphorous-based coating of the present invention is a dense-coverage, adherent phosphate or phosphonate layer bonded to the native oxide surface of a substrate of titanium material. As described above, these layers can promote adhesion between the titanium material and an applied chemical species, for example, when applied to a medical implant which is then contacted to living bone tissue, the layer can promote adhesion between the implant upon which such surface layers are formed and bone tissue. The present invention also provides a dense-coverage, adherent, derivatized surface on the oxide coating of a titanium material which is amenable to further derivatizing reactions that utilize hydrolytically reactive reagents to thereby provide a dense, adherent surface coating of these derivatizing species.

The methods of producing the phosphorous-based coatings of the present invention are not critical. It will be appreciated that many variations may be employed. In general, the surface to be coated is contacted with a phosphorous-based acid solution, the solvent removed, and the surface to be coated is then heated and held at temperature for a period of time while reaction between the phosphorous-based acid and the oxide surface proceeds.

In a typical coating procedure, the surface to be coated is prepared by sanding the surface clean, rinsing the sanded surface with solvent, for example, methanol, methylene chloride, and methyl-ethyl ketone, and drying the surface under conditions which preclude physisorbed water, for example, at 200° C. in the ambient environment.

Next, the surface is exposed to a phosphorous-based acid solution, and the solvent is allowed to evaporate, leaving a self-assembled film of phosphorous-based acid moieties on the surface.

Next, reaction between the film of phosphorous-based acid and the surface is initiated, for example, by heating the surface, for example, by placing the treated surface and substrate in an oven.

It will be appreciated that other methods of providing a coating of phosphorous-based acid on the oxide surface may also be employed, for example, by dipping the surface to be coated into a vessel containing the acid solution and draining the excess. A variation of this example is to dip the surface into a heated solution of the acid for a period of time which initiates reaction but does not substantially corrode the material, followed by annealing the material in an oven.

The coatings of the present invention are stable. Once formed, so long as fresh acid is not present, continued heating of the substrate and surface do not result in further reaction or degradation of the native oxide or phosphorous coating.

Typically, concentration of acid solutions will range from about 0.01 to about 30 mM of the acid species, although concentrations lying outside of this range may be used, for example, when the reaction rate of the phosphorous-based acid chosen is low.

The layer forms spontaneously and may be formed at any substrate temperature. Typically, it will be formed at temperatures between about 20° C. and about 200° C. to permit uniform application of the acid species to the surface oxide to be coated. Lower or higher temperatures depending on time to form and solubility of acid species. Temperatures outside of this range may be employed where solubility and/or reactions rates of the chosen acid species do not preclude doing so.

The reaction forming the phosphorous-based coating of the present invention (also described as "annealing") is typically carried out in the ambient environment because it is usually convenient to do so. It will be appreciated that it may also be carried out in inert environment, for example, in a vacuum oven or in an inert gas glow box.

Typically, the oxide surface is annealed at temperatures between about 100° C. and about 200° C. because the rate of film formation is reasonable at these temperatures and such an environment is accessible using simple ovens. Higher or lower temperatures may also be employed.

In general, it is convenient to drive the reaction using hot air heating of the surface, for example, using a drying oven, but methods of imparting energy to the surface, for example, radiant, microwave, or laser radiation, may also be used.

It will be appreciated that numerous means may be employed to evaporate the solvent and to drive the reaction of the phosphorous-based acid with the surface that will also provide the phosphorous-based coatings of the present invention.

Substrates suitable for use with the present invention include any titanium metal or alloy (hereinafter, "titanium materials") thereof capable of forming a native oxide surface. As described above, implantable medical and dental devices (hereinafter, "medical implants"), are frequently made from titanium materials.

Titanium metal from which medical implants are made typically has a purity such that the mass of the material is greater than about 98 wt. % titanium, for example, the Allvac series of titanium metal available from Allegheny Technologies Company, for example, Allvac 70, which comprises about 98 wt. % titanium and Allvac 30 CP-1, which comprises 99.5 wt % titanium. Although the present invention is applicable to bulk titanium metal which is of either lower or higher purity, and such material is not outside of the scope of the present invention, in general the lower purity material is not employed as medical implant material.

Typical titanium alloys from which medical implants are made contain at least about 80 wt % titanium, with the remainder comprising other metals and trace elements. Examples of titanium alloys (titanium materials containing more than trace amounts of other metals) which are used in the construction of medical implants are also found in the Allvac series of titanium alloys available from Allegheny Technologies Company, for example, Allvac Ti-15-Mo, which contains about 15 wt. % Mo and in excess of about 84% titanium, Allvac 6-4, which contains about 4% vanadium, about 6 wt. % aluminum, and in excess of 89 wt % titanium (which alloy is also described herein as Ti-6Al-4V), and Allvac 6-2-4-Si, which contains about 6 wt % aluminium, about 2 wt % molybdenum, about 2 wt. % tin, about 4 wt. % zirconium, and in excess of 85 wt. % titanium. Other purities and specifications of titanium alloys, whether used for the construction of medical implants or not, are known, and are also amenable to the present invention, and are therefore also contemplated in the term "titanium materials".

For the application of phosphonate coatings using the general procedures described above, the phosphorous-based acid used is selected from the organic phosphonic acids. For purposes of the present invention, "phosphonic acid" refers to compounds having the formula $H_2RPO_3$, wherein R is an organic ligand with a carbon atom directly bonded to phosphorus.

Phosphonic acid species which are useful in the formation of coatings of the present invention may have, as the organic ligand of the molecule, a hydrocarbon which comprises an alkylene or arylene. Generally, useful alkylene and arylene hydrocarbon ligands will comprise between about 2 and about 40 carbon atoms, although the present invention contemplates organic portions outside of this range as the properties desired of the coating formed dictate larger or smaller organic portions.

An alkylene organic ligand of a phosphonic acid suitable for use in the present invention may be linear or branched, saturated or unsaturated, and unsubstituted or with one or more substituents. An arylene organic ligand may comprise direct attachment of an aromatic moiety to the phosphorous atom of the phosphonic group, or it may be attached by an intervening alkylene moiety. Additionally, the arylene ligand may be incorporated into an alkylene chain (an arylene moeity having two or more alkyl substituents) or be a substituent depending from an alkylene chain. Substituent from arylene moieties may additionally be unsubstituted or may have one or more additional substituents.

Substituents on the hydrocarbon portion of phosphonic acids useful in the present invention may be appended to any carbon atom of the hydrocarbon ligand. Useful substituents are, for example, reactive functional groups, for example, a hydroxyl group, carboxylic group, an amino group, a thiol group and chemical derivatives thereof. It will be appreciated that any functional group which can participate in a further derivatization reaction can be employed. Additionally, an alkylene hydrocarbon ligand may contain within the structure or appended to the structure, reactive moieties, for example sites of unsaturation, which may be further reacted in a polymerization reaction with reactive substituents on the hydrocarbon ligands appended to other phosphonate sites bound to the surface of the native oxide during a phosphonate derivatizing reaction. In this manner, a phosphonate-organo-polymeric layer may be formed on the oxide surface. An example of such a polymerization reaction is the preparation of a surface coating of acrylic phosphonic acid. Unexpectedly, when acrylic acid and methacrylic acid substituents are employed, the polymerization proceeds spontaneously upon exposure to air. For less reactive coatings, the polymerization can be performed by exposing the coating to conventional polymerization reagents and conditions.

In a particularly preferred embodiment, coatings are formed from phosphonic acids having an organic ligand functionalized at the omega-carbon of the ligand which is further reacted to form covalent bonds with chemical precursors of bone tissue protein, such as amino acids, or with the bone tissue protein itself. For omega-functionalized phosphonic acids, the application of the acid to oxide surface generally results in a self-assembled phosphonic acid film with the omega-carbon directed away from the substrate surface and available for covalent bonding or further chemical modification. Preferred omega-functional groups include hydroxyl, amino, carboxylate and thiol groups.

Another class of substituents which may advantageously be bonded to a phosphonic acid organic ligand are pi-electron delocalized moieties. Essentially any pi-electron delocalized compound capable of reacting with a transition metal alkoxide to covalently bond a ligand of the moiety to the transition metal is suitable for use with the present invention. Particularly useful compounds are pi-electron delocalized aromatic ring compounds. A particularly preferred aromatic ring compound is a phenol, which has a relatively acidic hydrogen that is readily transferred to the transition metal alkoxide to initiate a reaction that results in the formation of a transition metal phenolate. Five-membered heteroaromatic ring compounds having proton-donating ring substituents capable of reacting with the transition metal alkoxide are also desirable because of their high degree of pi-electron delocalization. Examples of such rings include furan, thiophene and pyrrole.

It will also be appreciated that the reactive substituents pendant on the organic portion of a phosphonate bound to the oxide surface can be further reacted with reagents which are subject to hydrolysis reactions. Examples include metal alkoxides, examples of which are those having the structure $M(O-R)_n$, where M is a metal, R is a linear or branched, saturated or unsaturated, aliphatic or aromatic, substituted or unsubstituted hydrocarbon moiety, and "n" is equal to a stable valance state of the metal. Examples of metal alkoxide compounds are zirconium-tetra-t-butoxide and silicon-tetra-t-butoxide where R is a t-butyl group, M is respectively Zr and Si, and "n" is four. It will be appreciated that other hydrolytically reactive compounds which have two or more alkoxide ligands in addition to other ligands may also be utilized. In general, alkoxide ligated metals in groups 4 through 14 will find utility in these secondary functionalization reactions with phosphonate coatings of the present development.

Adherent, dense-coverage, phosphate coatings bound to the native oxide surface of a titanium material (hereinafter, "a coating of Ti-phosphate") may be prepared by treatment of the surface under mild conditions with phosphoric acid according to the general procedure described above. For purposes of the present invention, "phosphoric acid" is defined according to its' well-understood meaning, $H_3PO_4$. In the process of the present invention, treatment of a native oxide surface with phosphoric acid forms an inorganic phosphate coating that is rich in free hydroxyl groups. When the native oxide surface of a titanium material is coated with a phosphate coating of the present development and analyzed by XRD, two different titanium phosphate species were identified on its surface. One component, $Ti_4H_{11}(PO_4)_9 \cdot H_2O$, could be easily removed by rinsing with water, but the other, Ti-phosphate, remained on the surface. Indeed, XRD analysis of the rinsed foil, which had a dull purplish gray color, showed peaks only for Ti-phosphate, which were identical to those of powdered $H_2TiPO_4$. There is no long range order to the Ti-phosphate coating, and profilimetry of the surface (at 5 mm/s with 5 mg force) showed rough surfaces. The resistance of Ti-phosphate to removal from Ti by rinsing of "peeling" with Scotch® tape was verified by XRD analysis; the change in relative intensities of XRD peaks for Ti-phosphate on the Ti substrate were measured before and after these tests was inconsequential. Since there is no preferred orientation for Ti-phosphate on the Ti substrate, phosphate group-derived hydroxyls of Ti-phosphate are likely also randomly oriented. The hydroxyl groups of the present invention phosphate coatings are available for further chemical modification (derivatizing), and may be reacted with, for example, hydrolytically reactive reagents, as described above for the phosphonate layers having reactive substituents. As with the phosphonate coating, further reaction of the phosphate hydroxyl moieties results in dense coverage of the surface by the derivatizing species. In this manner, species which would only provide a sparse coating on the native oxide if reacted directly can be used to provide a much denser coating on the phosphate derivatized surface.

Aqueous phosphoric acid solutions having a concentration up to about 3.0 M are preferred. For preparation of phosphate coatings of the present invention, phosphoric acid solutions having a pH more acidic than about pH 3.0 are preferred. Although these preferred ranges are convenient for providing coatings of the present invention, values outside of this range may be employed when reactivity and solubility considerations permit.

The concentration of phosphonic acid required to form an inorganic phosphate coating on an oxide surface is that concentration of phosphoric acid effective to form a stable film on the substrate surface without excessively dissolving the substrate. This can readily be determined by those of ordinary skill in the art without undue experimentation.

As with the coatings of phosphonate containing hydroxyl substituents, the hydroxyl groups of the Ti-phosphate coatings of the present invention can also serve as reactive sites for covalent attachment of hydrolytically reactive reagents, for example, Zr or Si alkoxides. It is observed, by comparison of infrared absorbance by a characteristic feature of a surface bound moiety, that surface loadings of these organometallics are 1-2 orders of magnitude higher on Ti-phosphate coatings than those obtained on the native oxide of Ti in which only about 15% of surface oxygen is derived form hydroxyl groups.

Alkyl amines and silanes are reagents commonly used to couple functionalized organics to a variety of hydroxylated surfaces, and bond readily to the phosphate surfaces of the present invention. For example, octadecyl(triethoxy)silane reacts irreversibly with Ti-phosphate but not with the Ti native oxide surface under comparable conditions. The phosphate surfaces of the present invention may be further derivatized by reagents typically used to react with hydroxylated oxide surfaces of non-titanium materials.

As described above, the native oxide surface of titanium materials is not amenable to profound alteration of the chemical properties of the surface using typical derivatizing reactions. In addition, as described above, the coverage of hydroxyl groups on a native oxide surface of titanium materials is sparse, thus, derivatizing reagents which react with hydroxyl groups (hydrolytically reactive reagents) typically yield a coverage by the derivatizing species which is too sparse to provide for a significant change in the behavior of the surface of the material. This is particularly problematic with respect to attempts to alter the native oxide surface of titanium materials with these reagents to promote adhesion when the materials are placed in contact with bone tissue.

The phosphate or phosphonate coatings of the present invention provide a layer which is sufficiently adherent and provides dense-coverage of a reactive surface directly bonded to the native oxide surface of titanium materials. Studies indicate that coverage yielded by reactioning phosphate coating hydroxyl groups of the present invention with derivatizing reagents yield coverage of the oxide surface that is about one to two orders of magnitude greater than that obtainable by direct reaction of the derivatizing reagent with the surface hydroxyl groups of the native oxide surface. These dense-coverage, adherent phosphate or phosphonate coatings also can promote the adhesion of bone tissue, and are amenable for further derivatization by chemical species which further promote adhesion and proliferation of osteoblasts.

The phosphate coatings of the present invention are rich in free hydroxyl groups. The phosphonate coatings can be made to have hydroxyl groups by using precursor acids having hydroxyl group substituents. Each of these coating layers may be further functionalized to promote covalent attachment to bone tissue proteins, or precursors thereof, for example, by using thiol compounds of the type conventionally employed to promote adhesion between gold metal implants and bone tissue. The hydrocarbon ligands of the organopolyphosphonate coatings may likewise be functionalized at a substituent on the organic ligand portion as described above for phosphonate ligand coatings to form covalent bonds with chemical precursors of bone tissue protein or with the bone tissue protein itself.

The coatings of the present invention can be applied to essentially any implant intended for bone or dental tissue contact fabricated from a material having an oxide surface at the intended bone or cental tissue interface. Implants made of titanium and alloys thereof may be employed, as well as implants which are made of materials that can be provided with an adherent titanium oxide surface. Additionally, the phosphorous-based coatings of the present invention may be applied to oxide surfaces of materials other than titanium-materials and provide similar potential for bone adhesion.

The methodology of the present invention enables strong adhesion between a dental or osteopathic implant and incipient bone tissue via a network of strong chemical bonds. An implant device can be fabricated and its surface processed ex-situ to provide a composite coating on the implant surfaces that will give rise to a strong, non-fracturable bone-to-implant seal following implantation. The methodology is amenable to vapor-phase or solution-phase (aerosol spray-on or "dip coating") chemistry and proceeds under mild conditions, especially compared to plasma or laser-induced deposition. Adhesion of the phosphorous-based surface coating has been found to exceed 40 M Pascals of shear stress.

More complex species, for example, a protein or peptide, may also be bonded via the derivatized surface of the present invention to the underlying native oxide surface of an implant. For example, bonding the fibronectin cell attachment peptide, arginine-glycine-aspartic acid (RGD) to a surface through an organic tether is thought to enhance the osteoconductivity of the surface by providing sites for cell attachment and spreading. As described above, conventional methods for such providing surface peptide attachment to Ti alloys are often problematic and only low yields of such attachment are possible. Using the surface bonded coating of the present development, for example, a carboxylate-functionalized phosphonate coating, a cysteine-modified fibronectin cell attachment peptide (RGDC), which is commercially available (American Peptide), affords the possibility of attachment of the peptide to a reactive site on a surface of the present invention via formation of a thiol-ester bond using the surface coating of the present invention treated with traditional organic derivatization reaction techniques. It will be appreciated that other derivatization reactions are also possible.

EXAMPLES

Example films of phosphonates and phosphates were prepared on coupons of metal foil or on disks of metal cut from billet. As noted, samples were prepared in some cases by dip coating the coupon in a bulk solution of the coating moiety and in others by aerosol application of the solution to a surface of the coupon. Aerosol application of monofunctional phosphonic acids was carried out by dissolving the acid in tetrahydrofuran (THF), spraying the acid solution onto the target oxide surface. As noted, aerosol application was carried out either in the ambient environment by spraying a solution of the acid from a pump-spray bottle, or with the target surface residing in a standard nitrogen charged glove box.

The solvent was allowed to evaporate from the sample either with gentle heating and/or a gas current, for example, nitrogen flowing over the surface, or left to evaporate to the ambient environment by spraying in a solution of the acid from a pump-spray bottle. Where noted, solvent evaporation was carried out in the ambient environment, or in an inert atmosphere glove box. For application of difunctional phosphonic acids, two procedures were followed. In the first procedure, a THF solution of the phosphonic acid was applied to the target oxide surface while its substrate rested in the ambient atmosphere on a hot plate to aid evaporation of the solvent. The treated oxide surface and substrate were then transferred to a 120° C. oven and annealed at oven temperature for up to 48 hours. Following removal from the oven and cooling, the derivatized surface was rinsed with dry, distilled THF to ensure only bound species remained. The residue of rinsing solvent remaining on the coupon was evaporated and the coupon surface was subjected to analysis.

In the second procedure, the substrate was placed in a vessel containing a quantity of acid solution, the solvent was evaporated with the substrate in place and the substrate was annealed in an oven to react the phosphoric acid solvent to the surface with the native oxide.

In the formation of phosphate coatings, spray or dip procedures, described above, were employed to pre-coat the native oxide surface with phosphoric acid solution. Where noted, phosphoric acid was used as either a THF or aqueous solution.

Films were analyzed using a quartz microbalance and by FTIR spectroscopy, X-ray powder diffraction spectroscopy, contact angle measurement and "peel testing". The following procedures were used.

Quartz Crystal Microbalance (QCM)

The QCM technique allows accurate, gravimetric determination of mass changes on an electrode which is deposited on a piezoelectric quartz crystal. It is, thus, ideal to monitor surface reactions of target metals when they are used as such electrodes: the QCM oscillates at a resonant frequency which is determined by the cut and mass of the crystal, and, just as for a classical oscillator, changes in electrode mass result in changes in crystal resonant frequency. Since our experiments necessitated detaching active crystals from the QCM oscillator for extended periods of time followed by reattachment, control measurements had to be made of reference crystals which were subjected to similar handling, but without surface treatment. Up to three different reference crystals (prepared in different batches) were used as received to calibrate the QCM. Careful handling of the active and reference crystals was observed to prevent unacceptably large (>10 Hz) frequency change from the initial value, during an experimental run. To ensure that monolayer coverage (at most) occurred on Ti surface, phosphonic acid-based films were subjected to copious rinsing followed by evacuation ($\leq 10^{-2}$ Torr) until a constant crystal frequency was established (within experimental noise levels of ±2 Hz).

Piezoelectric quarts crystals (International Crystal Manufacturers [ICM]; AT-cut, 1000 Å Ti electrodes, 10 MHz, overtone polished, 0.201 in. electrode diameter) were used for film deposition and as references. The QCM circuitry was allowed to stabilize for 30 min. after start-up, before experimental measurements were made. In each experimental run, the fundamental frequency ($f_o$) of an unreacted crystal was measured. The crystal was then removed from its holder, aerosol sprayed (on both electrodes) with a solution of the phosphorous-based acid and heated at 120° C. for 3 days. A new frequency ($f_c$) was then measured. The crystal was then subjected to rinsing followed by evacuation ($\leq 10^{-2}$ Torr) until a constant frequency was measured (±2 Hz), assumed to be a monolayer coverage of the Ti electrodes. The difference between the monolayer-loaded and the unreacted crystal was then related to the amount of material chemisorbed on the Ti electrode active area.

The quartz crystal microbalance (QCM) was driven by a home-built Clapp oscillator and powered by a Hewlett Packard 6234A Dual Output Power Supply. The frequency of the crystal was measured using a Hewlett Packard 5334B Universal Counter and a record of the frequencies was tracked using a laboratory computer. A change in the observed frequency indicated a change in the mass of the crystal. To insure that all the frequency changes were attributable to the deposition of the reactants, the frequency of the crystal was monitored before and after exposure to reactants.

X-ray Powder Diffraction

Samples were analyzed by X-ray diffraction using a Rigaku Miniflex spectrometer with CuK$\alpha$ radiation and a Zn filter. Samples were scanned for 2$\theta$=8–55° (0.04°/2 sec). Data were analyzed and refined and matched with that of known species using Jade 3.0 Pattern Processing for Windows. Samples were placed on glass microscope slides using Dow Corning Vacuum Grease, and were placed in an appropriate holder.

Infrared Spectroscopy

Samples were analyzed using either a Nicolet 730 FT-IR equipped with a Spectra Tech diffuse reflectance (DRIFT) attachment or a MIDAC Illuminator equipped with a Surface Optics specular reflectance head. When the Nicolet was used for analysis, infrared experiments were performed using a glancing angle attachment, a Variable Angle Specular Reflectance Model 500, obtained from Spectra Tech. The angle between the surface normal and the incident beam was approximately 87°. For both instruments, samples were purged with nitrogen for half an hour to reduce the amount of water on the surface, and 1,000 scans were collected to obtain a reasonable signal to noise ratio. All spectra obtained were ratioed against a spectrum of a clean native oxide surface.

"Peel-testing"

Coupons which had been treated were rinsed several times with deposition solvent and, where appropriate, ethanol and/or water, to remove soluble residues. A piece of tape (e.g. 3M red Scotch® "650" tape or Scotch Masking Tape #234; 37 oz/in adhesion to steel) was adhered to the derivatized surface of the solvent washed foil sample and quickly removed. The freshly "peeled" coupon was then analyzed again by DRIFT spectroscopy.

Contact Angle Measurement

Contact angles were measured at room temperature and ambient conditions on a Tantec Contact Angle Meter CAM-F1.

All reagents were obtained from Aldrich Chemical unless otherwise noted. Propionic acid (99+ percent), octanoic acid (99.5+ percent), and stearic acid (99.5+ percent) were used as received, 11-phosphonoundecanoic acid (an 11 carbon atom, linear difunctional phosphonic acid with an ω-carboxylic acid functional group to the phosphonic acid) 11-hydroxyundecylphosphonic acid (a linear, 11 carbon atom difunctional phosphonic acid having an (ω-hydroxyl functional group to the phosphonic acid) were synthesized by a published procedure. Tetra(tert-butoxy)zirconium (TBZ) was distilled at $10^{-1}$ torr and 80° C. The distilled product was stored in a nitrogen dry box, in the dark, and at −40° C. until needed. Otherwise, solvents were used as purchased. Titanium (0.25 mm; 99.6%), aluminum (0.25 mm; 99.0%); and iron (0.125 mm; 99.5%) foils and titanium Ti-6Al-4V billet (all obtained from Goodfellow, Inc.) were prepared for use by sanding, followed by cleaning with methanol, and cut into ca. 1 cm×1 cm coupons (foils) or 1 inch diameter disks (billet). The coupons were dried for at least an hour before use, and stored in an oven at 200° C.

The first set of comparative examples demonstrate the films which can be formed on various native metal oxide surfaces using ambient temperature contact of the surface with a carboxylic and a phosphonic acid, both of which represent classes of art-recognized oxide surface derivatizing agents.

Comparative Examples

Comparative Example 1

Carboxylic Acid Treatment of Aluminum Native Oxide

A coupon of aluminum was prepared as described above. A 1.0 mM solution of stearic acid in iso-octane was prepared for deposition on the aluminum coupon. Deposition was carried out by immersing the aluminum coupon into the stearic acid solution for 24 hours, then washed with fresh iso-octane. The presence of a stearic acid film was confirmed by IR spectroscopy. The self-assembled monolayer alignments were confirmed by contact angle measurements. Washing the substrates after they were immersed in the carboxylic acid solutions aided in the removal of molecules that were not bound to the aluminum, but were merely sitting on the surface.

The films formed in solution were stable. The stearic acid film, which formed in 24 hours, was removed by anhydrous ethyl ether under mild conditions in the same amount of time. The monolayer-coated aluminum substrate was placed in ether at room temperature without using any stirring device. Removal of a significant portion of the film within 90 minutes was confirmed by IR spectroscopy. After removing the monolayer, it was possible to establish another monolayer on the aluminum surface by repeating the same technique. This could be done repeatedly, but there was a gradual erosion of the aluminum substrate.

From the IR information, it was apparent that the interaction between the carboxylic acid and the metal oxide substrate surface was weak, as illustrated by the ability to produce and remove the monolayer under mild conditions. The nature of the interaction is apparently hydrogen bonding between the acid and the hydroxyls on the surface of the metal. Apparently, covalent bonds are not formed because, if they were, much more vigorous conditions would be required to remove the carboxylic acid from the surface of the metal oxide.

Comparative Examples 2-4

Ambient Phosphonic Acid Treatment of Aluminum, Iron, and Titanium Native Oxide Surfaces Samples of coupons of aluminum, iron, and titanium, prepared as described above, were treated with an aerosol of n-octadecanephosphonic acid in tetrahydrofuron (THF) at room temperature in the ambient environment. Following the spray application of the acid solution the solvent was allowed to evaporate at ambient temperature and the derivatized surfaces of the coupons were analyzed by FTIR. The surfaces where then washed with THF and analyzed both before and after a peel test using red Scotch® "650" tape. The analysis shows that on iron, the phosphonic acid forms a layer on the native surface oxide that, while of sparse coverage, survives both washing and peel testing. In the case of the aluminum samples, a weakly bound phosphonic acid layer is formed that survives washing, but not peel testing. For the titanium sample, any phosphonic acid which absorbed to the surface was readily removed by washing with the deposition solvent.

Comparative Examples 5

Vacuum-anneling of Phosphonic Acid Coating Applied to Titanium Native Oxide Surfaces A titanium coupon, prepared as described above was treated with a 0.8 mM THF solution of octadecanephosphonic acid in the form of an aerosol spray under dry $N_2$. The treated coupon was placed under vacuum ($10^{-1}$ torr), and sealed off. The coupon remained in the evacuated vessel for six hours. DRIFT analysis before and after rinsing of the sample demonstrated that none of the phosphonic acid remained on the surface after rinsing in THF.

The next group of examples demonstrates derivatization of titanium oxide surfaces according to the present invention using a phosphonic acid and phosphonic acid derivatives.

Example 1

Formation of a Bound Phosphonic Acid Film on a Titanium Native Oxide Surface A titanium coupon, prepared as described above was treated with a 0.6 mM THF solution of octadecanephosphonic acid in the form of an aerosol spray under dry $N_2$. The treated coupon was left under a current of dry nitrogen until the solvent evaporated. Following solvent evaporation the sample was heated for 18 hours at 110° C. in air. The coupon was cooled to ambient temperature and rinsed twice with THF. This cycle of application, heat annealing, and rinsing was repeated five times. DRIFT analysis of the resulting coating on the coupon demonstrated that a phosphonate surface coating was bonded to the surface and remained after rinsing and peel testing. The coupons thus prepared were stored in an oven at 200° C. there being no upper limit on annealing time.

Example 2

Formation of a Difunctional, Bound Phosphonic Acid Film on a Titanium Native Oxide Surface A 5 mM solution of 11-phosphonoundecanoic acid in dry, distilled THF was aerosol sprayed onto a titanium coupon prepared as described above using the procedure described above for preparation of films using difunctional phosphonic acids. Analysis by infrared spectroscopy (IR) of the resulting surface films produced show the characteristic IR stretches observed for alkyl chains and for bound phosphonic acids, indicating that the phosphonate group was bound to the surface of the coupon and the ω-carboxylic acid groups were oriented away from the surface and hydrogen bonded.

Example 3

Formation of a Difunctional, Bound Hydroxy-Phosphonic Acid Film on a Titanium Native Oxide Surface A 10 mM THF solution of 11-hydroxyundecylphosphonic acid was applied to a titanium coupon, prepared as described above, as an aerosol using the procedure described for Example 2, except that baking of the sample was limited to 18 hours post application. Infrared analysis indicated that the phosphonic acid portion of the coating precursor was bound to the native oxide and showed a broad peak between 3300-3600 $cm^{-1}$ indicative of hydrogen bonded hydroxyl groups as well as characteristic peaks for the aliphatic chain.

Example 4

Formation of Bound, Mixed-Difunctional Phosphonic Acid Coating on a Titanium Native Oxide Surface Using the procedure described for Example 2, above, coatings comprising mixtures of 11-phosphonoundecanate acid and either 4-phosphonobutyrate, decanephosphonate or a mixture of these species in any ratio will be prepared by aerosol applications of a solution containing a mixture of these species. The ratio of surface bound materials will be found to be close to that of the ratio of acid constituents of the solution applied. Subsequent coupling chemistry (with, for example, a phenol or an amino acid) can be accomplished to optimize yields of elaborated surface films by controlling the microenvironments of the ω-carboxlic acid termini in this manner. Similar experiments can be done for mixtures containing ω-hydroxyalkylphosphonate as well.

In the second and third groups of examples, following, films formed on titanium metal coupons using difunctional phosphonic acids (both the ω-carboxylic acid and ω-hydroxyl functional films) are further reacted with moieties useful in demonstrating the reactivity of the layer and with other moieties which are useful in the promotion of bone adhesion.

Examples 5-6

Further Derivatization of Titanium Oxide Surface Bound ω-Difunctional 11-Undecanoic Phosphonic Acid In this second group of examples, the free carboxylic acid portion of the difunctional phosphonate layer applied to the surface of a titanium coupon prepared according to Example 2 is further reacted at the carboxylic acid site by esterification of the acid with a phenol, an amino-acid, and with a peptide.

Example 5

Formation of Amino Acid Amides of Bound ω-Difunctional 11-Undecanoic Phosphonic Acid Coating on a Titanium Native Oxide Surface Coupons were derivatized with a carbodiimide/hydroxysuccinimide coupling reagent. Coupons prepared according to Example 2 were stirred in an aqueous solution (75 mM) of 1-ethyl-3-(3-dimethyl-aminopropyl)carbodiimide and 20 mM N-hydroxysuccinimide to form the imido adduct of the acid. The coupons thus treated were then transferred to a beaker of a 75 mM solution of lysine in water. The coupons were then extensively rinsed with water and dried under vacuum. FTIR analysis indicates the presence of an amide (coupling of the carboxylic acid of the phosphonate and the amine functional group of the lysine amino acid).

Example 6

Formation of Peptide Thio-esters of Bound ω-difunctional 11-Undecanoic Phosphonic Acid Coating on a Titanium Native Oxide Surface The use of a surface of the present invention to bind short peptides to a Ti or alloy surface is demonstrated next. A cyateine-modified peptide, RGDC (Arg-Gly-Asp-Cys), described above which occurs in Firbronectin cell-adhesive protein, is selected for attachment to the carboxylic acid ends of surface layers on titanium coupons prepared according to Example 2, above. The coupons are first treated with a solution of dicyclohexylcarbodiimide and N-(6-hydroxyhexyl) maleimide in dichloromethane to provide the ω-carboxylic acid groups of the derivatized surface of the coupon with a maleimide ester group that will react with thiol functionality in the cysteine of the modified peptide. Foils are then bathed in an aqueous solution of RGDC (Arg-Gly-Asp-Cys) to couple the thiol group of cysteine to the immobilized maleimide group, leading to the attachment of RGDC to the ω-carboxylic acid-maleimide, yielding a bioactivated Ti surface.

In this second group of examples, the free hydroxide portion of the difunctional phosphonate layer applied to the surface of a titanium coupon prepared according to Example 3 using 11-hydroxy-undecylphosphonic acid is further reacted at the hydroxy functional group by conventional organic chemistry with dansyl chloride, an amino-acid, and with a peptide Example 7

Reaction of Titanium Oxide Surface Bound ωDifunctional 11-Hydroxy-Undecyl Phosphonic Acid With Dansyl Chloride Titanium coupons prepared according to Example 3 above were placed in a solution of approximately 10 mg of dansyl chloride and 0.1 mL of triethylamine in 10 mL of acetonitrile. The solution was stirred for 18 hours under $N_2$. Coupons were removed from the solution, blotted dry and rinsed with acetonitrile. The coupons were then subjected to FTIR analysis which indicates, by the presence of new peaks at 1600 $cm^{-1}$ and at 1200-1100 $cm^{-1}$, that a sulfonate ester formed. The dansyl adduct has a characteristic fluorescence spectrum, and fluorescence microscopic analysis of the coupons confirms the formation of the surface-bound dansyl ester product. The fluorescence spectroscopy also indicates that the coating is dense-coverage and uniform over the entire surface of the coupon.

For the next two examples, the surface bound hydroxyphosphonate is converted into the maleimide adduct according to the following procedure. A coupon prepared according to Example 3, above, is placed into a solution of about 15 mg of 3-maleimido-(propionic-acid-N-hydroxysuccinimide) ester in 10 mL of acetonitrile. The coupon is then transferred into a nitrogen glove box and place into an ambient temperature maleimide solution for 24-72 hrs, after which, coupons are removed from the solution and blotted dry, and rinsed with acetonitrile. FTIR analysis indicates peaks corresponding to 11-hydroxyundecylphosphonate bound to the surface of the coupon through the phosphonate functional group, with additional peaks at 1731 and 1707 $cm^{-1}$ corresponding to the carbonyl stretches of the maleimide adduct.

Examples 8

Reaction of Titanium Oxide Surface Bound ω-Difunctional 11-Hydroxy-Undecyl Phosphonic Acid with Cysteine Coupons having the phosphonate-maleimide adduct, prepared as described above on titanium coupons prepared according to Example 3, were placed in a stirred solution of 15 mg. of cysteine dissolved in 10 mL of doubly distilled, Millipore™—filtered water for 8-24 hrs. The foils were removed from solution, dried, and rinsed in doubly distilled water. FTIR analysis of the coupons showed changes in the maleimide carbonyl region and a new peak at ca. 1700 $cm^{-1}$, indicative of the presence of cysteine bound to the coupon.

Examples 9

Reaction of Titanium Oxide Surface Bound ω-Difunctional 11-Hydroxy-Undecyl Phosphonic Acid with a Peptide Coupons containing the phosphoric coated-maleimide adduct, prepared as described above from titanium coupons prepared according to Example 3, are placed in a solution of the peptide RGDC (Arg-Gly-Asp-Cys) used to prepare coupons of Example 7, above. The RGDC solution comprises about 10 mg of the peptide in 10 mL of doubly distilled, Millipore™-filtered water. Coupons are stirred at ambient temperature for about 8 to about 48 hours. The coupons are removed from solution, dried, and rinsed in doubly distilled water. FTIR, analysis before and after peptide treatment demonstrates changes in the maleimide carbonyl region and broadening in the carboxylate region (~1700 $cm^{-1}$) which persists after two solvent rinses, indicating the presence of the RGDC tetrapeptide bound to the coupons.

It will be appreciated that peptides and amino acids can be "tagged" with a fluorescent marker by covalent bonding a small fluorescent species, such as dansyl chloride as an ester or thioester to the parent compound. It will be appreciated that amino acids and peptides which are bound to phosphonate species bonded to oxide surfaces, such as are described above can be tagged before or after such bonding reactions. When the surface species amino acid and peptide adducts are "tagged" in this manner, examination of the coupons by fluorescence microscopy after derivitization indicates the coatings of the peptide bounded to the coupon are dense and uniform over the entire coupon.

The next group of examples demonstrates the dense-coverage of a titanium native oxide surface that can be achieved with the coating of the present invention.

Examples 10-11

Formations of a Phosphonate Coating on a Titanium Quartz Microbalance Electrode

As described above, quartz microbance electrodes were treated with octylphosphonic acid and 11 hydroxy undecylphosphonic acid to form an octylphosphonate and undecylphosphonate coating on the native oxide layer on the electrodes, the results of microbalance measurement of the density of surface coverage for the two species is presented below in Table I.

TABLE 1

Surface coverage of Ti by alkylphosphonates.

| Phosphonate | Δf(Hz) | Coverage $(nmol/cm^2)^{a,b}$ |
|---|---|---|
| Octylphosphonate | 109 | 2.46 (1.89) |
|  | 115 | 2.60 (2.0) |
| 11-Hydroxyundecylphosphonate | 141 | 2.46 (1.89) |
|  | 165 | 2.87 (2.21) |
|  | 115 | 2.00 (2.21 |
|  | 140 | 2.44 (1.88) |

$^a$As measured by QCM
$^b$Corrected value for surface roughness factor measured to be 1.3 by AFM analysis of the sputtered Ti electrode given in ( ).

Example 12

Atomic Force Microscopy of an Octadecylphosphonate Coating

A coating of octadecylphosphonate on the native oxide surface of a polished titanium coupon was prepared by the aerosol method described above using a 0.75 mM THF solution of octadecylphosphonic acid. The acid solution was applied under nitrogen and evaporated using the ambient method. The spray-heat-rinse cycle was repeated 6 times. The resultant coating was studied by atomic force microscopy (AFM) using a Dimension 3000 (Digital Instruments) operated in "soft" TappingMode. An AFM micrograph of the polished Ti foil surface shows it to have grooves (resulting from the polishing process), but regions between these grooves are appreciably flat (mean roughness≈0.7 nm; FIG. 3). Section analyses examined surface roughness in more detail. The morphology of the surface changed dramatically on formation of the octadecylphosphonic acid film. On coated coupons, AFM micrograph and section analysis showed islands (typical diameter≈50 nm) of similar height (≈2.2 nm), consistent with monolayer formation on the surface, and the mean roughness of the surface increased to 1.5 nm on monolayer attachment. With reference to film height data obtained for a self-assembled monolayer of this same phosphonic acid on mica (≈1.8 nm), an alkyl chain tilt angle of about 33° was estimated. The AFM analysis indicates the coating is of dense-coverage. Correction of the microbalance results of Examples 10 and 11 by the AFM data indicate a surface coverage in excess of 20 times of that observed for reactions of the native oxide hydroxyl sites, described above.

The next example demonstrates the use of a functionalized alkyl-phosphonate coating of the present invention to bond a bone-growth promoting peptide RGDC (described above) to the surface of a titanium alloy (Ti-6Al-4V), and the use of this derivatized surface in adhering and proliferating osteoblasts.

Example 13

Application of a Phosphonate Coating to a Titanium Alloy and Subsequent Peptide Derivatization to Provide an Osteoblast Adhesion Promoting Surface Disks of Titanium Alloy Ti-6Al-4V prepared as described above were coated with a layer of 11-hydroxyundecylphosphonate by placing them in a vessel filled with a 10 mM THF solution of 11-hydroxyundecylphosphonic acid. The THF was allowed to evaporate and the disks were then baked in an oven at 120° C. for 48 hours and were rinsed in dry THF. Thus prepare the titanium alloy disks were further derivatized with the cysteine modified fibronectin cell attachment peptide argynine glycine aspartic acid (RGDC) which has been described above.

The RGDC peptide [American Peptide] was bonded to the phosphonate coating using a maleimide coupling procedure. The maleimide derivative of the hydroxy functionalized phosphonate coating was prepared by placing the coated disk into a 5 mM acetonitrile solution of 3-maleimidopropionic acid-N-hydroxysuccinimide ester for a period of 24 hours at room temperature. Thus prepared the maleimide adduct was rinsed with a fresh acetonitrile solution. The disks were transferred into an acetonitrile solution of the peptide described above, RGDC, with stirring for 24 hours, yielding the peptide bound via a thiol ester linkage through the cysteine residue to the hydroxy end of the phosphonate coating.

These modified titanium alloy disks were examined for their interaction with human osteoblasts. Human fetal osteoblasts (HFOB 1.19; ATCC) were maintained in a 1:1 mixture of Ham's F12 and Dulbecco's modified Eagle's medium (DMEM), without phenol red (GIBCO, BRL), 10% fetal bovine serum (Hyclone Laboratories) and 0.3 mg/ml G418 (GIBCO, BRL). Cells were labeled with 10 µM Cell Tracker Orange (Molecular Probes, OR) for 30 minutes at 34° C. After this time, the medium was removed and replaced with fresh medium and serum for an additional 30 minutes at 34° C. Cells were released from tissue culture dishes using 0.2 mg/ml EDTA in PBS, washed with PBS, resuspended in serum-free medium at $1\times10^5$/ml, and 500 µl of the cell suspension was added to wells containing the metal disk substrates which had been blocked with 1% BSA in PBS for 30 minutes before cell addition. Cells were allowed to spread on the substrates for 90 minutes, after which time they are washed with PBS and visualized using a Nikon Optiphot-2 microscope. Images were captured using a Photometrics Coolsnap camera and analyzed using Coolsnap and IP labs software.

The results of this study indicate that human osteoblasts can adhere and propagate on surfaces prepared according to the present invention.

Examples 1-12 were duplicated by treating coupons made from titanium alloy Ti-6Al-4V (Goodfellows) under the same conditions and with the same reagents used for the titanium coupons used in Examples 1-12. Results were the same, demonstrating that the coatings of the present invention can be applied equally well to the native oxide of titanium alloys using the methods of the present invention.

The next group of examples demonstrates the use of phosphoric acid to form an intermediate layer on titanium metal native oxide surfaces which may be further derivatized with other moieties, and a derivatized surface which can promote osteoblast adhesion and spreading.

Examples 14-15

Dip-Treatment of Titanium Native Oxide Surfaces in Phosphoric Acid Solution

In Example 14, a coupon of Titanium foil (99.6+% annealed), prepared as described above, was immersed in 1.4M aqueous $H_3PO_4$ (pH=1.5) at room temperature for one hour, then heated at 110° C. for greater than 16 hours. After two rinsings with THF, examination by DRIFTS showed that it had a coating of $Ti(H_2PO_4)_3$ (hereinafter Ti-phosphate) remained that could not be rinsed away.

In Example 15, titanium coupons prepared and described above were dipped in an aqueous solution of phosphoric acid (1.45 m; pH 1.5) for 1 hr at ambient temperature an pressure. The coupons were then removed from solution and warmed in an oven at 120° C. for 18 hrs., then cooled, rinsed with water, and "peeled" with masking tape to remove any weakly adsorbed material. X-ray powder diffraction analysis and Diffuse Reflectance Fourier Transform Infrared analysis (DRIFT) confirmed the presence of phosphate coating (Ti-phosphate).

Coated coupons were prepared in accordance with Example 15 and further derivatized using the spray/heat/rinse procedure described above using the reagents indicated below in Table II.

TABLE II

| Example | Derivatizing species | Solute concentration/ solvent | Baking temperature/time |
| --- | --- | --- | --- |
| 16 | octadecyl(triethoxy)silane | 1.8 mM/THF | 120° C./24 hrs. |
| 17 | octadecanethiol | 1.0 mM/THF | 60° C./24 hrs. |
| 18 | octadecylamine | 1.0 mM/THF | 60° C./18 hrs. |
| 19 | octadecyl(triethoxy)-silane | 0.8 mM/THF | 120° C./16 hrs. |

Example 20

Treatment of Phosphate Coatings with Hydrolytically Reactive Megal Alkoxides Coupons prepared according to example 15 were put in a horizontal tube which could be externally cooled and which was equipped with two stopcocks for exposure to vacuum ($10^{-3}$ Torr) or to vapor phase tetra(tert-butoxy)zirconium (Zr(O-t-but)$_4$). Coupons were subjected to three cycles each consisting of alternating exposure to vapor of Zr(O-t-but)$_4$ with external evacuation for 15 min, followed by 30 min exposure to the organometallic reagent vapor without external evacuation. The first cycle was done at room temperature, and the latter two with external cooling by dry ice. Coupons were then subjected to room temperature vacuum ($10^3$ Torr) for 16 hrs to remove any physisorbed Zr(O-t-but)$_4$. DRIFT analysis confirmed formation of dense-coverage surface Zr alkoxide.

Example 21

Derivatization of a Dense-coverage Zr Alkoxide Bound to Titanium

Coupons prepared according to Example 20 were sprayed with 1.75 mM solution of octadecylphosphonic acid in dry tetrahydrofuran (THF). Samples were evacuated overnight (0.1 Torr), rinsed with THF, "peeled," tested and analyzed by DRIFT. The analysis demonstrated an adherent alkyl-phosphonate coating bonded to the zirconated surface.

The derivitization reactions of Examples 14 through 21 were repeated, using the same reagents and conditions on coupons of Ti-6Al-4V (Goodfellows) prepared according to the procedure described for Example 15 above. Analysis of the filing showed that titanium alloy can be derivitized in the same manner with the same results seen from the titanium.

The next group of examples demonstrates the use of a phosphate coating of the present development to provide a derivatized surface on a titanium material which promotes the adhesion and proliferation of osteoblasts.

Examples 22-23

Adhesion of Osteoblasts to a Titanium Material Phosphate Coated Peptide Derivatized Surface Disks cut from titanium billet and from titanium alloy Ti-6Al-4V billet were prepared and coated with a phosphate coating according to Example 15.

A phosphate coated disk of each material was placed in a Teflon® well and they were each treated with a solution of amino propyl-(tri ethoxy)-silane (10 mM in THF), and then solvent rinsed, with sonication, to give surface-bound 3-amino-propyl siloxanes. These disks were then further derivatized by placing each in a 5 mM acetonitrile solution of 3-maleimidopropionic-acid-N-hydroxysuccinimide-ester for 18 hours at room temperature to give the maleimide adduct. The disks were removed from solution, solvent evaporated, and analyzed by IR. They were then rinsed in acetonitrile, with sonication, and dried in vacuo (0.1 Torr). The disks were further derivatized by placing them into a solution of the RGDC peptide used in Example 13 above, (5 mM), prepared in 5 ml of purified water (Millipore), with the pH adjusted to 6.5 using 0.1 M NaOH. The disks remained in the peptide solution stirring at room temperature for 24 hours. Formation of the surface bound RGDC was verified by IR. The disks were then rinsed with water, dried, subjected to tape peel testing, and reanalyzed by IR. The peptide coating was found to be adherent.

The peptide coated disks were subjected to the human osteoblast test described above in Example 13. The results showed that the surface promoted the adhesion and proliferation of osteoblasts.

Example 24

Derivitization of Phosphate Coating with 11-Mercaptoundecanoic Acid

Mercaptoundecanoic acid was recrystallized from ethanol at room temperature. A solution of mercaptoundecanoic acid (1.0 mM in THF) was applied by aerosol deposit onto coupons of titanium and of titanium alloy Ti-6Al-4V. The coupons were placed under N$_2$ for 6-12 hrs in a horizontal tube equipped with a stopcock to regulate N$_2$ flow and pressure, then evacuated at 0.1 Torr for at least 4 hrs, and analyzed by DRIFT. A dense coating of the mercaptan was found adhered to the surface of both the metal and alloy.

What is claimed is:

1. A method of forming a coated article on a metal oxide surface comprising:
    a. depositing a layer of a solution of a phosphorous-based acid on a metal oxide substrate;
    b. removing solvent from the deposited solution layer so that a film of the phosphorus-based acid forms on the substrate; and
    c. heating said metal oxide substrate from step (b) so as to react the phosphorus-based acid with the substrate until said film is bonded thereto,
    wherein said phosphorous-based acid is selected from the group consisting of H$_3$PO$_4$ and organo-phosphonic acids and said H$_3$PO$_4$ reacts to form a phosphate bond with said oxide metal substrate thereby providing an inorganic phosphate coating comprising free hydroxyl groups.

2. The method of claim 1, wherein the metal oxide surface is the native oxide of a titanium material substrate.

3. The method of claim 1 wherein said oxide surface layer is heated to a temperature between about 100 and about 200° C.

4. The method of claim 1, wherein said phosphorous-based acid moiety is an organo-phosphonic acid containing a hydrocarbon ligand having from about 2 to 40 carbon atoms, said hydrocarbon ligand comprising a linear or branched, saturated or unsaturated, aliphatic or aromatic alkylene moiety.

5. The method of claim 4, wherein said hydrocarbon ligand comprises an unsaturated alkylene moiety, and the method further comprises the step of polymerizing said unsaturated alkylene moiety.

6. The method of claim 4, wherein said hydrocarbon ligand contains a pi-electron delocalized structure.

7. The method of claim 6, wherein said pi-electron delocalized structure is an aromatic ring compound.

8. The method of claim 1, wherein the organophosphonic acid forms a self-assembled monolayer coating with phosphonate bonds to the metal oxide surface and the organo groups contain reactive sub substituents.

9. The method of claim 8 further comprising the step of reacting said reactive sub stituents with a metal alkoxide reagent having two or more alkoxide ligands, thereby forming a layer comprising said metal alkoxide covalently bonded to said phosphonate coating, said metal alkoxide layer comprising unreacted alkoxide ligands.

10. The method of claim 9, wherein said metal alkoxide is selected from the group consisting of reagents comprising metals from groups 4-14 ligated with 2 or more alkoxide ligands.

11. The method of claim 10, wherein said metal alkoxide has the formula M(tert-butoxide)$_4$, where M is Zr or Si.

12. The method of claim 11, wherein said titanium oxide surface is a derivative surface of a polymeric, metallic, or ceramic material with a surface bearing a metal oxide layer.

13. The method of claim 8, wherein said reactive substituents comprise omega-functional groups selected from the group consisting of hydroxyl, carboxylate, thiol and amino groups for the covalent attachment of bone tissue proteins and the chemical precursors thereof.

14. The method of claim 13, wherein said omega functional groups are thiol or amino groups.

15. The method of claim 1, wherein said phosphorus-based acid comprises an organo-phosphonic acid having a hydrocarbon ligand containing from 2 to 40 carbon atoms.

16. The method of claim 15, wherein said hydrocarbon ligand is a satu-rated or unsaturated, substituted or unsubstituted, aliphatic or aromatic alkylene group.

17. The method of claim 16, wherein said hydrocarbon ligand is omega-substituted with a substituent selected form the group consisting of hydroxyl, amino, carboxylate or thiol groups.

18. A method for improving the adhesion to bone tissue of implantable medical devices having a titanium oxide surface for contacting said bone tissue, said method comprising coating said surface with phosphoric acid or an organo-phosphonic acid according to the method of claim 1.

19. A method for attaching an implantable device to bone tissue, said device having a titanium oxide surface for contacting said bone tissue, said method comprising first coating said oxide surface with phorphoric acid or an organo-phosphonic acid according to the method of claim 1.

20. A method for coating an implantable device for attachment to bone tissue, said device having a titanium oxide surface for contacting said bone tissue, said method comprising coating said surface with phosphoric- or an organo-phosphonic acid according to the method of claim 1.

21. The method of claim 1, wherein said removing step comprises evaporating solvent from said solution so that a film of said phosphorus-based acid forms on said substrate.

22. The method of claim 1, wherein said depositing step comprises dipping said metal oxide substrate into a vessel containing said phosphorus-based acid solution and draining the excess acid solution.

* * * * *